United States Patent
Young et al.

(10) Patent No.: US 8,332,550 B1
(45) Date of Patent: Dec. 11, 2012

(54) METHOD AND APPARATUS FOR A HOT-SWAPPABLE INPUT/OUTPUT DEVICE WITH PROGRAMMABLE OVER-VOLTAGE CLAMP PROTECTION

(75) Inventors: Phillip A. Young, Albuquerque, NM (US); Honggo Wijaya, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/871,885

(22) Filed: Aug. 30, 2010

Related U.S. Application Data

(62) Division of application No. 11/999,195, filed on Dec. 3, 2007, now Pat. No. 7,809,864.

(51) Int. Cl.
*H03K 19/0175* (2006.01)
*G06F 3/00* (2006.01)

(52) U.S. Cl. .............. 710/36; 710/34; 710/35; 361/90; 361/93.9; 326/83; 326/86

(58) Field of Classification Search .............. 326/83, 326/86; 713/320; 710/34–36; 365/226
See application file for complete search history.

(56) References Cited

U.S. PATENT DOCUMENTS

| | | | |
|---|---|---|---|
| 5,933,025 | A | 8/1999 | Nance |
| 6,028,450 | A | 2/2000 | Nance |
| 6,255,850 | B1 | 7/2001 | Turner |
| 6,256,926 | B1 | 7/2001 | Nakada |
| 6,577,163 | B1 | 6/2003 | Waldrip |
| 6,653,873 | B1 | 11/2003 | Nguyen |
| 6,768,363 | B2 | 7/2004 | Yoo et al. |
| 7,209,333 | B2 | 4/2007 | Lee et al. |
| 7,324,316 | B2 | 1/2008 | Chen et al. |
| 7,376,037 | B1 * | 5/2008 | Law et al. .............. 365/226 |
| 7,853,811 | B1 * | 12/2010 | Walstrum et al. .......... 713/320 |

OTHER PUBLICATIONS

U.S. Appl. No. 11/999,195, filed Dec. 3, 2007, Young, Phillip A., Xilinx, Inc., 2100 Logic Drive, San Jose, CA 95124, USA.

* cited by examiner

*Primary Examiner* — Tammara Peyton
(74) *Attorney, Agent, or Firm* — John J. King

(57) ABSTRACT

A method of operating an input/output interface is described. The method comprises eliminating a current path into an output pin of an input/output interface while the input/output interface receives an operational power signal during a first mode of operation; and enabling the current path into the output pin of the input/output interface to limit a voltage magnitude externally applied to the output pin of the input/output interface during a second mode of operation.

15 Claims, 6 Drawing Sheets

METHOD AND APPARATUS FOR A HOT-SWAPPABLE INPUT/OUTPUT DEVICE WITH PROGRAMMABLE OVER-VOLTAGE CLAMP PROTECTION

FIELD OF THE INVENTION

The present invention generally relates to input/output devices, and more particularly to a method of operating an input output interface.

BACKGROUND OF THE INVENTION

A programmable logic device (PLD) is a general-purpose device that can be programmed by a user to implement a variety of selected functions. One type of PLD is the field programmable gate array (FPGA), which typically includes an array of configurable logic blocks (CLBs) surrounded by a plurality of input/output blocks (IOBs). The CLBs are individually programmable and can be configured to perform a variety of logic functions on selected input signals. The IOBs can be configured to drive output signals from the CLBs to external pins of the FPGA and/or to receive input signals from the external FPGA pins.

The FPGA also includes a programmable interconnect structure that can be programmed to selectively route signals among the various CLBs and IOBs to produce more complex functions of many input signals. The CLBs, IOBs, and programmable interconnect structure are programmed by loading configuration data into associated configuration memory cells that control various switches, multiplexers, and look-up tables (LUTs) within the CLBs, IOBs, and programmable interconnect structure to implement logic and routing functions specified by the configuration data. As such, FPGAs inherently provide a high degree of configurability and are, therefore, ideally suited for a plurality of hardware applications.

For example, FPGAs are ideally suited for the implementation of an I/O interface that is capable of supporting a large number of input/output (I/O) interface standards. For example, many modern processing systems operate according to the peripheral component interconnect (PCI) standard, which among other features, defines a specification for attaching peripheral devices to a computer mother board. In other examples, modern processing systems may also utilize the high speed transceiver logic (HSTL) standard for data transfers to and from memory, and/or the low-voltage differential signaling (LVDS) standard for backplane communications.

As each new I/O standard is introduced, a corresponding specification is published to define I/O signal parameters, e.g., voltage out high ($V_{OH}$), voltage out low ($V_{OL}$), rise-time, fall-time, duty cycle, etc., that conform to the new I/O standard. In addition, output driver behavior during various non-operational modes of the I/O interface may also be defined. For example, the PCI33 and PCI66 specifications dictate certain behavior that must be exhibited by an I/O interface when the I/O interface is operating in a tri-state mode, i.e., when the I/O interface is non-conductive.

In particular, the PCI33 and PCI66 specifications require that in the event an external transient voltage exceeding the operational voltage magnitude, e.g., $V_{CCO}$, of the I/O interface is applied to the I/O interface during the tri-state mode, then the I/O interface must transition from the tri-state mode to a conductive mode. In such an instance, the I/O interface must be sufficiently conductive so as to "clamp" the over-voltage magnitude to a magnitude that is substantially equal to $V_{CCO}$. Once the over-voltage condition subsides, the I/O interface transitions back to the tri-state mode.

The ability to clamp over-voltage conditions to $V_{CCO}$, however, conflicts with another requirement of the I/O interface. In particular, hot-socketability, also referred to as hot-swappability, is the ability to electrically and mechanically engage a non-powered, fully populated printed circuit board to an interface, such as a computer mother board, that is powered and functional. Such an operation is consistent with the universal serial bus (USB) specification, for example, whereby any USB device may be connected to an operational computer via a standardized interface socket, such that the USB device becomes interoperable with the computer without the need to re-boot the computer.

Such a plug-and-play operation, however, is not consistent with the over-voltage clamp requirement because certain conduction paths within the I/O interface must be eliminated in order to conform to the hot-swappable functionality. In other words, the I/O interface must be conductive during an over-voltage condition in order to conform to the PCI33/PCI66 specification, but must also be non-conductive in order to conform to the USB specification for hot-swappability.

Efforts continue, therefore, to provide an I/O interface that may be configured to conform to the requirements of one I/O standard and reconfigured to conform to the conflicting requirements of another I/O standard.

SUMMARY OF THE INVENTION

To overcome limitations in the prior art, and to overcome other limitations that will become apparent upon reading and understanding the present specification, various embodiments of the present invention disclose a method and apparatus to provide an I/O interface that may be configured to conform to the requirements of one I/O standard and reconfigured to conform to the conflicting requirements of another I/O standard.

In accordance with one embodiment of the invention, a method of operating an input/output interface comprises eliminating a current path into an output pin of the input/output interface while the input/output interface does not receive an operational power signal, eliminating the current path into the output pin of the input/output interface while the input/output interface receives the operational power signal during a first mode of operation, and enabling the current path into the output pin of the input/output interface to limit a voltage magnitude externally applied to the output pin of the input/output interface during a second mode of operation. The external voltage magnitude being limited to a voltage magnitude of the operational power signal.

According to an alternate embodiment, a method of operating an input/output interface comprises eliminating an current path into an output pin of an input/output interface while the input/output interface receives an operational power signal during a first mode of operation; and enabling the current path into the output pin of the input/output interface to limit a voltage magnitude externally applied to the output pin of the input/output interface during a second mode of operation.

According to a further embodiment, a method of operating an input/output interface comprises eliminating a current path into a output pin of an input/output interface while the input/output interface receives an operational power signal during a hot swap mode of operation; and enabling the current path into the output pin of the input/output interface to limit a voltage magnitude externally applied to the output pin of the input/output interface during a clamping mode of operation.

BRIEF DESCRIPTION OF THE DRAWINGS

Various aspects and advantages of the invention will become apparent upon review of the following detailed description and upon reference to the drawings in which.

DETAILED DESCRIPTION

Generally, various embodiments of the present invention are applied to the field of integrated circuits (ICs) of which programmable logic devices (PLDs) are a subset. In particular, a method and apparatus is provided for a configurable input/output (I/O) interface within the PLD to allow support for a plurality of I/O standards. The I/O interface of the PLD may be configured to support I/O signal behavior that conforms to the specification of a first I/O standard and may be reconfigured to support conflicting I/O signal behavior that conforms to a second I/O standard. Although the examples below are explained with respect to a programmable logic device, embodiments of the present invention may be used with any integrated circuit that may have an I/O interface that can be configured for more than one I/O standard.

In a first embodiment, the configurable I/O interface of the present invention exhibits a default operation that facilitates hot-swappability, while a programmable option of the configurable I/O interface alleviates an over-voltage condition while the I/O interface is tri-stated. Thus, a single configuration memory cell may be employed within the PLD, such that a first logic value provided by the configuration memory cell configures the I/O interface for hot-swappable operation, while a second logic value provided by the configuration memory cell configures the I/O interface for over-voltage protection, i.e., clamp operation. In other embodiments, configuration of the I/O interface for either hot-swappable operation, or over-voltage protection, may be programmed dynamically within the user logic portion of the PLD.

Figure 1:
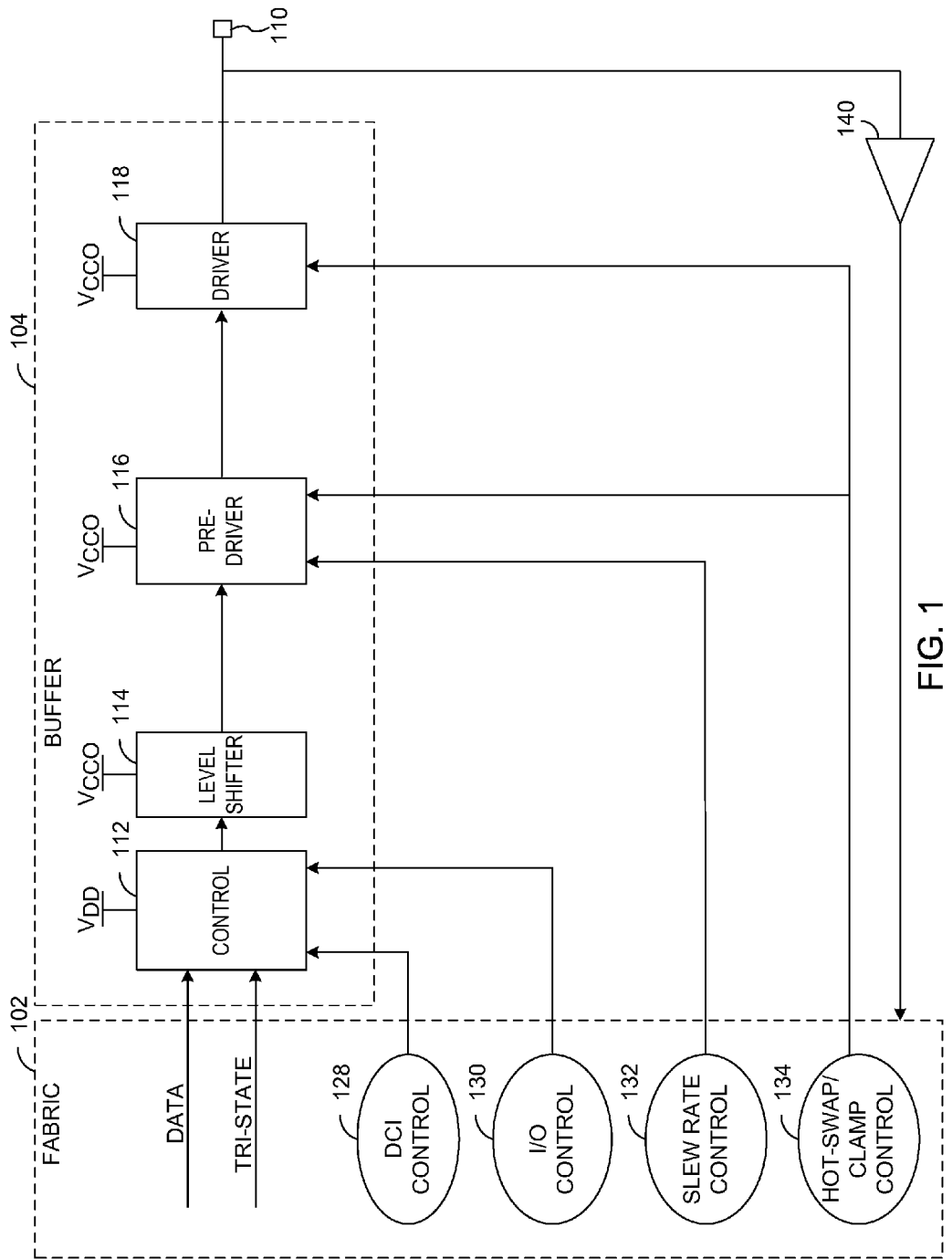
FIG. 1 illustrates a schematic diagram of an input/output (I/O) interface in accordance with an embodiment of the present invention.

Turning to FIG. 1, a schematic diagram of each component of an I/O interface that may exist within a PLD, such as a field programmable gate array (FPGA), is illustrated. FPGA fabric 102 may assert/deassert signal TRI-STATE, so as to disable/enable, respectively, output buffer 104. Similarly, FPGA fabric 102 may provide signal DATA to output buffer 104 given that output buffer 104 is enabled by signal TRI-STATE. It should be noted that while the I/O buffer of FIG. 1 provides output buffer 104 to transmit signal DATA from fabric 102 to output pad 110, input buffer 140 may be similarly provided, which operates to receive a signal from input pad 110 and in response, provides the received data signal to fabric 102.

Data and control inputs are received by output buffer 104 from fabric 102 of the FPGA to configure output buffer 104 to operate in accordance with a plurality of I/O standards. In particular, the schematic diagram of FIG. 1 illustrates components of an FPGA based I/O interface that may be configured to support I/O standards such as low-voltage complementary metal oxide semiconductor (LVCMOS), low-voltage transistor-transistor logic (LVTTL), high-speed transceiver logic (HSTL), stub-series terminated logic (SSTL), gunning transceiver logic (GTL), and peripheral component interface (PCI).

Variations of each I/O standard may be configured using digitally controlled impedance (DCI) control 128, I/O control 130, and slew rate control 132, all of which are provided by configuration memory cells and/or dynamic control signals from fabric 102. In addition, hot-swappability and over-voltage clamp control may be configured using hot-swap/clamp control block 134 of fabric 102.

Using control blocks 130-132, for example, the output signal parameters of output buffer 104, such as voltage out high ($V_{OH}$), voltage out low ($V_{OL}$), duty cycle, rise time, and fall time may be configured. In addition, should the I/O standard require on-die termination impedance, DCI control 128 is utilized to activate the appropriate transistor bank(s) within driver 118 so as to implement the required termination impedance. As discussed in more detail below, hot-swap/clamp control block 134 configures output buffer 104 for operation as a hot-swappable buffer, such as may be required by the universal serial bus (USB) specification, or conversely, configures output buffer 104 for over-voltage protection, such as may be required by the PCI33 or PCI66 specifications.

Control block 112 operates at a first voltage magnitude, e.g., $V_{DD}$, which is the same operational voltage magnitude that is utilized by fabric 102. Since pre-driver 116 and driver 118 operate at a relatively higher voltage magnitude, e.g., $V_{CCO}$, level shifter block 114 is required, which translates data operating at the core voltage magnitude, e.g., $V_{DD}$, to data operating at the I/O voltage magnitude, e.g., $V_{CCO}$.

Driver 118 is comprised of a number of transistor banks, whereby each transistor bank contains a variable number of n-type metal oxide semiconductor (NMOS) transistors and a variable number of p-type metal oxide semiconductor (PMOS) transistors. Each of the variable number of PMOS transistors have drain terminals that are commonly coupled to the drain terminals of the variable number of NMOS transistors. The gate terminals of each PMOS transistor are commonly coupled to a first select signal, e.g., PGATE, while the gate terminals of each NMOS transistor are commonly coupled to a second select signal, e.g., NGATE.

Figure 2:
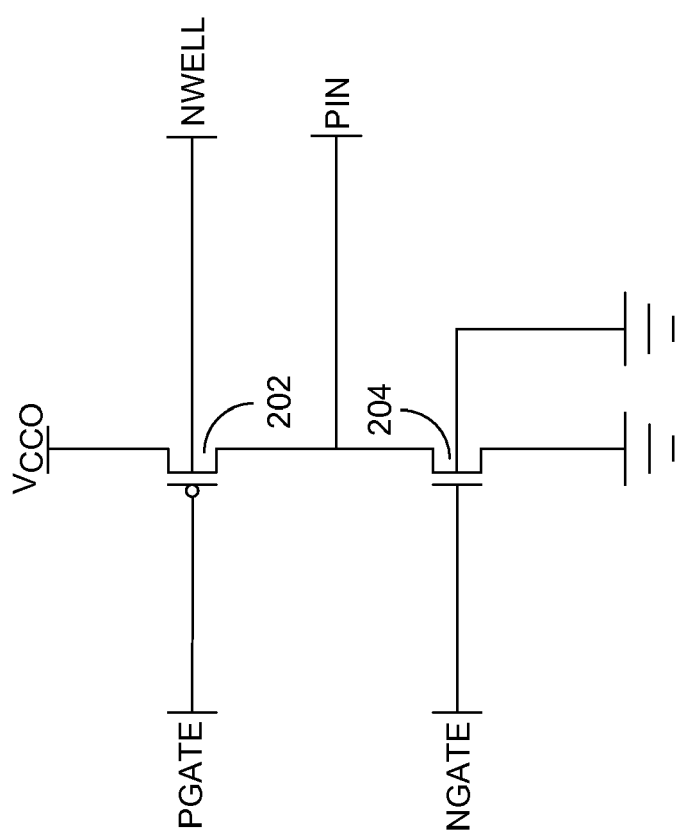
FIG. 2 illustrates a schematic diagram of one of many driver pairs that exist within one of many driver banks of the output driver of the I/O interface of FIG. 1.

Turning to FIG. 2, a single transistor pair is illustrated, whereby the combination of PMOS transistor 202 with NMOS transistor 204 exemplifies one of many transistor pairs that are contained within one of the many driver banks of driver 118. In operation, select signals PGATE and NGATE are deasserted by pre-driver 116 to a logic low level when the signal at output pad 110, i.e., terminal PIN, is required to be selected to a logic high level, e.g., $V_{CCO}$. Similarly, signals PGATE and NGATE are asserted by pre-driver 116 to a logic high level when the signal at terminal PIN is required to be selected to a logic low level, e.g., ground potential. If the output driver of FIG. 2 is required to be in a tri-state configuration, signal PGATE is asserted to a logic high level and signal NGATE is deasserted to a logic low level by pre-driver 116.

Typically, the well region of a PMOS transistor is hardwired to the source terminal of the PMOS transistor, which is also connected to the operational voltage, e.g., $V_{CCO}$. The well region of PMOS transistor 202, on the other hand, is instead connected to terminal NWELL, as opposed to being connected to the source terminal of PMOS transistor 202, so as to control at least two parallel current leakage paths that would ordinarily exist during an over-voltage event in hot-swap mode. The first leakage current path exists due to PMOS transistor conduction characteristics, whereby if the voltage magnitude that is externally applied to terminal PIN exceeds the voltage magnitude that is applied to the gate terminal of PMOS transistor 202, then PMOS transistor 202 is rendered conductive.

The second leakage current path exists due to the forward biasing of the body diode of PMOS transistor 202 when the voltage magnitude that is applied to the drain terminal, i.e., terminal PIN, exceeds the voltage magnitude that is applied to the well region, which is usually equal to $V_{CCO}$. During an over-voltage event, for example, the voltage magnitude at terminal PIN may be sufficient to forward bias the body diode of PMOS transistor 202, which creates a current path from the drain terminal of PMOS transistor 202 to the well region of PMOS transistor 202, which is also connected to $V_{CCO}$ in typical implementations. Such a current path, however, may lead to the so-called "latch-up" condition, which can disrupt or even destroy the operational characteristics of PMOS transistor 202.

As such, the well region of PMOS transistor 202, as well as the well regions of many of the other PMOS transistors of driver 118 and hot-swap/clamp control block 134, are connected to well bias circuitry, as discussed in more detail below, in order to limit the magnitude of current that is conducted by the second leakage current path. The well bias circuitry, however, is also effective to allow the first leakage current path to exist, so as to enhance clamp current conduction during an over-voltage event while in clamp mode.

In particular, if the voltage magnitude of $V_{CCO}$ is substantially equal to zero volts and the voltage magnitude of signal PGATE is equal to a logic low level, then in the absence of a bias signal applied to terminal NWELL, PMOS transistor 202 is rendered conductive if an external voltage applied to terminal PIN is greater than $V_{CCO}$ by one threshold voltage, $V_t$, of PMOS transistor 202. In such an instance, the second leakage current path, as discussed above, exists from terminal PIN to $V_{CCO}$ through PMOS transistor 202. Thus, bias signal NWELL is adjusted by hot swap/clamp control 134 in order to defeat the second leakage current path in hot-swap mode. In clamp mode, on the other hand, bias signal NWELL is controlled by hot-swap/clamp control block 134 to lower the threshold voltage of PMOS transistor 202, so as to enhance clamp current conduction during an over-voltage event using the first leakage current path as discussed above.

Figure 3:
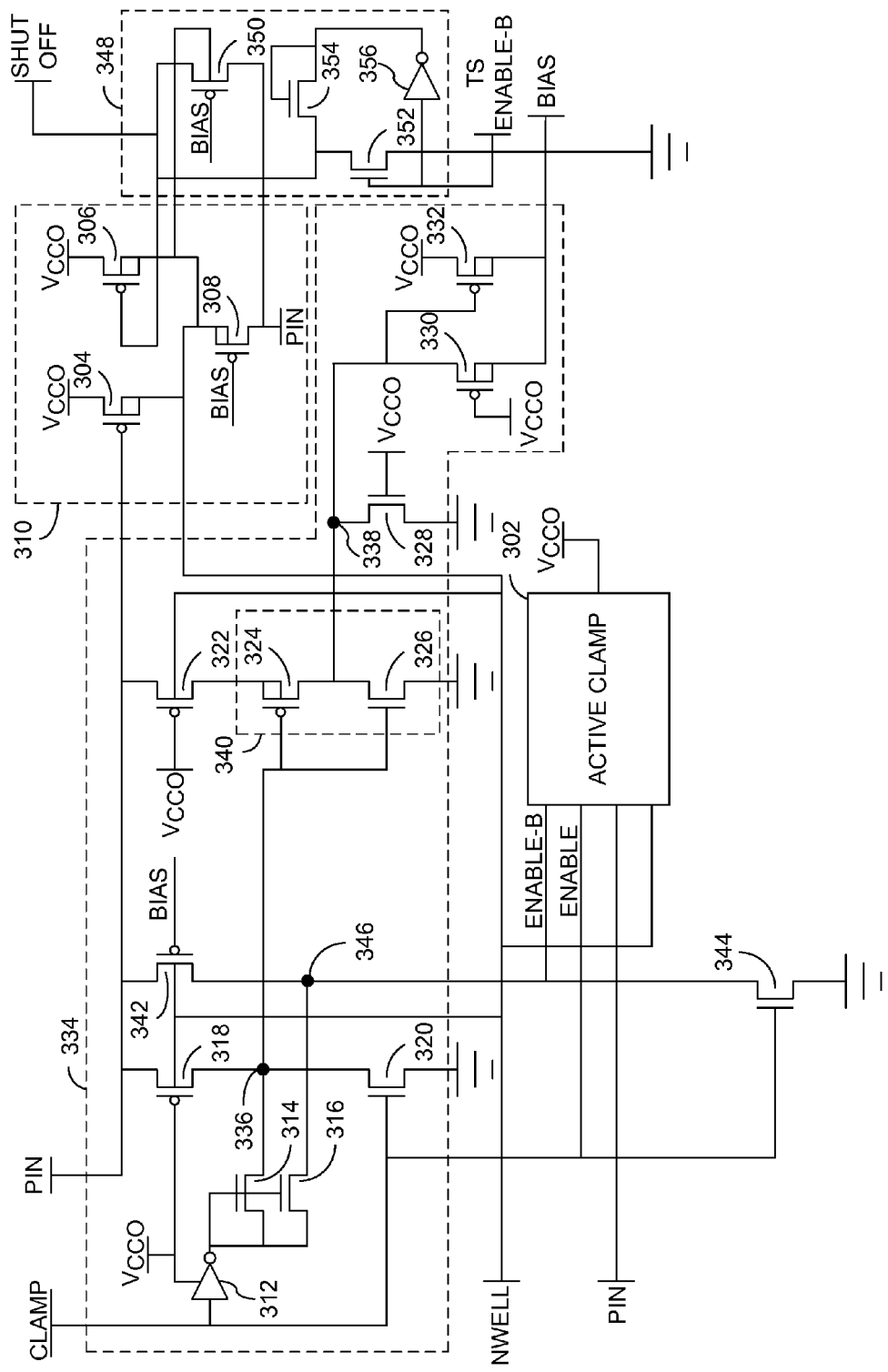
FIG. 3 illustrates a schematic diagram of the hot-swap/clamp control block of the I/O interface of FIG. 1 in accordance with an embodiment of the present invention.

Turning to FIG. 3, a schematic diagram of hot-swap/clamp control block 134 is illustrated. Hot-swap/clamp control block 134 determines whether output buffer 118 behaves in accordance with a hot-swap mode of operation, or whether output buffer 118 behaves in accordance with a clamp mode of operation. In one embodiment, the logic level of a clamp control signal, e.g., CLAMP, provided by fabric 102 may be programmed/configured to a logic low level, whereby output buffer 118 behaves as a hot-swappable device. Conversely, the logic level of signal CLAMP may be programmed/configured to a logic high level, whereby output buffer 118 provides over-voltage protection at terminal PIN during the clamp mode of operation. It is understood that the mode of operation of each output buffer (not shown) of the FPGA is similarly controlled either via independent configuration memory cells within fabric 102, or by dynamically controlled logic values within fabric 102.

The clamp mode of operation is effective when output buffer 118 is tri-stated, where as discussed above, signal PGATE is asserted to a logic high level and signal NGATE is deasserted to a logic low level. If the voltage level at terminal PIN is raised above signal PGATE by one $V_t$ of PMOS transistor 202, then PMOS transistor 202 is rendered conductive to conduct current from terminal PIN to $V_{CCO}$. Such a conduction path is beneficial during the clamp mode of operation, since the conduction path partially facilitates clamping of the voltage magnitude that is present at terminal PIN. The current conduction path provided by PMOS transistor 202, however, is insufficient to provide adequate clamp control at terminal PIN in accordance with either of the PCI33 or PCI66 I/O standards. Thus, additional current conduction circuitry, as discussed in more detail below, is provided.

During the hot-swap mode of operation, on the other hand, the current conduction path from terminal PIN to $V_{CCO}$ must be defeated. As discussed in more detail below, therefore, additional circuitry is provided so that PMOS transistor 202 may be biased to a non-conductive state should the voltage magnitude at terminal PIN exceed the voltage magnitude of $V_{CCO}$. Signal NGATE is deasserted to a logic low level during either of the hot-swap, clamp, or tri-state modes of operation. As such, NMOS transistor 204 is conductive only when the logic level at terminal PIN is deasserted to a logic low level during a normal mode of operation.

The well regions of many of the PMOS transistors within hot-swap/clamp control block 134, as well as many of the PMOS transistors within pre-driver 116 and driver 118, are required to be biased to the correct potential using well bias control block 310 of FIG. 3. In operation, well bias control block 310 either charges terminal NWELL to the voltage magnitude of $V_{CCO}$, or well bias control block 310 charges terminal NWELL to the voltage magnitude that is present on terminal PIN.

In particular, if the voltage magnitude of $V_{CCO}$ is greater than the voltage magnitude present at terminal PIN, then transistor 304 is rendered conductive to apply a voltage magnitude to terminal NWELL that is equal to $V_{CCO}$. If the voltage magnitude of $V_{CCO}$ is greater than the voltage magnitude present at terminal SHUT OFF, then transistor 306 is rendered conductive to apply a voltage magnitude to terminal NWELL that is equal to $V_{CCO}$. Alternately, if the voltage magnitude present at terminal PIN is greater than the voltage magnitude of signal BIAS, then transistor 308 is rendered conductive to apply a voltage magnitude to terminal NWELL that is equal to the voltage magnitude present at terminal PIN.

Bias control block 334 is utilized to provide signal BIAS to the gate terminals of several transistors within hot-swap/clamp control block 134, e.g., transistors 342, 308, and 350, which are illustrated as having control terminals that are virtually connected to terminal BIAS. Control of signal BIAS depends upon the logic state of signal CLAMP, which as discussed above, is defaulted to a logic low value via fabric 102 to activate hot-swap mode. Signal CLAMP may also be programmed via fabric 102 to a logic high value, which activates clamp mode. In general, bias control block 334 seeks to maintain the voltage magnitude of signal BIAS to be equal to $V_{CCO}$, except during an over-voltage event at terminal PIN during clamp mode. If an over-voltage event occurs at terminal PIN during clamp mode, then bias control block 334 maintains the voltage magnitude of signal BIAS to be equal to the voltage magnitude that is present on terminal PIN.

In operation, if signal CLAMP is deasserted to a logic low value, thereby activating hot-swap mode, then node 336 is pulled to within one $V_t$ of $V_{CCO}$ through operation of inverter 312 and transistor 314. If signal CLAMP is deasserted to a logic low value, but the voltage at terminal PIN exceeds $V_{CCO}$ to create an over-voltage condition at terminal PIN, then transistor 318 is rendered conductive to apply the voltage magnitude at terminal PIN to node 336.

If signal CLAMP is asserted to a logic high value, thereby activating clamp mode, and the voltage magnitude at terminal PIN exceeds $V_{CCO}$, then an over-voltage condition exists and transistors 318 and 320 are both rendered conductive. The conductive states of transistors 318 and 320, however, establishes contention at node 336. Since the geometric dimensions of transistor 320 are larger than the geometric dimensions of transistor 318, however, the conductive state of transistor 320 dominates the conductive state of transistor 318, which is effective to pull the voltage magnitude at node 336 to a logic low value, e.g., ground potential.

In summary, therefore, node 336 is always held to a logic low value by bias control block 334 when clamp mode is enabled. If clamp mode is disabled and no over-voltage condition exists at terminal PIN, then bias control block 334 maintains node 336 to a voltage magnitude that is substantially equal to $V_{CCO}$. If clamp mode is disabled and an over-voltage condition exists at terminal PIN, on the other hand, then bias control block 334 applies the voltage magnitude that is present at terminal PIN to node 336.

Transistors 324 and 326 of bias control block 334 form inverter 340 whose operational power is derived from transistor 322. Transistor 322, however, is only conductive when the voltage magnitude at terminal PIN exceeds $V_{CCO}$ by one $V_t$ of PMOS transistor 322, i.e., when an over-voltage condition exists. Thus, if no over-voltage condition exists, then the logic level at the output of inverter 340, i.e., node 338, is either at a logic low value or is undetermined. Since transistor 328 is always conductive, however, then a logic low level is applied to node 338 when inverter 340 derives no operational power from transistor 322.

During an over-voltage event, on the other hand, transistor 322 supplies operational power to inverter 340. In such an instance, the logic level existing at node 338 is dependent upon the logic level existing at node 336. If the logic level at node 336 is high, i.e., during hot-swap mode, then node 338 is deasserted to a logic low level. If the logic level at node 336 is low, i.e., during clamp mode, then node 338 is asserted to be equal to the operational voltage magnitude supplied to inverter 340, which is equal to the voltage magnitude at terminal PIN during an over-voltage event. If no over-voltage event occurs during clamp mode, then node 338 is deasserted to a logic low value.

PMOS transistors 330 and 332 are cross-coupled as illustrated, such that either the logic level at node 338, or the voltage magnitude of $V_{CCO}$, is provided to terminal BIAS. In particular, if the logic level at node 338 exceeds $V_{CCO}$, i.e., during an over-voltage event in clamp mode, then transistor 330 is rendered conductive to provide the voltage magnitude at terminal PIN to terminal BIAS. If the logic level at node 338 does not exceed $V_{CCO}$, then the voltage magnitude of $V_{CCO}$ is provided to terminal BIAS.

Turning to Table 1, a summary of the operation of the signal at terminal BIAS, as generated by bias control block 334, is presented. It can be seen that the voltage level at terminal BIAS remains equal to the voltage magnitude of $V_{CCO}$, except during an over-voltage event in clamp mode, in which case the voltage level at terminal BIAS is equal to the voltage magnitude at terminal PIN.

TABLE 1

| SIGNAL CLAMP | PIN VOLTAGE | SIGNAL BIAS |
|---|---|---|
| Logic low (hot-swap mode) | Less than or equal to $V_{CCO}$ | Equal to $V_{CCO}$ |
| Logic low (hot-swap mode) | Greater than $V_{CCO}$ | Equal to $V_{CCO}$ |
| Logic high (clamp mode) | Less than or equal to $V_{CCO}$ | Equal to $V_{CCO}$ |
| Logic high (clamp mode) | Greater than $V_{CCO}$ | Equal to voltage magnitude at terminal PIN |

As discussed in more detail below, active clamp 302 of hot-swap/clamp control block 134 provides circuitry to create a supplemental current conduction path from terminal PIN in response to an over-voltage condition during clamp mode. Signals ENABLE and ENABLE-B are dependent upon the logic level of signal CLAMP. If signal CLAMP is deasserted to a logic low level, for example, then signal ENABLE is deasserted to a logic low level and transistor 344 is rendered non-conductive. Signal ENABLE-B is asserted to a logic high level, i.e., one $V_t$ lower than $V_{CCO}$, through operation of inverter 312 and transistor 316 at node 346. If signal CLAMP is deasserted to a logic low level, but the voltage magnitude at terminal PIN exceeds the voltage magnitude at terminal BIAS, then transistor 342 is rendered conductive and signal ENABLE-B is asserted to a logic high level that is equal to the voltage magnitude at terminal PIN.

If signal CLAMP is asserted to a logic high level, on the other hand, then signal ENABLE is asserted to a logic high level, transistor 316 is rendered non-conductive, and transistor 344 is rendered conductive, thereby deasserting signal ENABLE-B to activate the clamp mode. Turning to Table 2, a summary of the operation of signal ENABLE-B, as generated by bias control block 334, is presented. It can be seen that the logic high level of signal ENABLE-B is approximately equal to $V_{CCO}$ when the voltage magnitude at terminal PIN is less than or equal to the voltage magnitude at terminal BIAS while in hot-swap mode. Conversely, the logic high level of signal ENABLE-B is equal to the voltage magnitude at terminal PIN when the voltage magnitude at terminal PIN exceeds the voltage magnitude at terminal BIAS while in hot-swap mode.

TABLE 2

| SIGNAL CLAMP | PIN VOLTAGE | SIGNAL ENABLE-B |
|---|---|---|
| Logic low (hot-swap mode) | Less than or equal to voltage magnitude at terminal BIAS | Approximately equal to $V_{CCO}$ |
| Logic low (hot-swap mode) | Greater than voltage magnitude at terminal BIAS | Equal to voltage at terminal PIN |
| Logic high (clamp mode) | Less than or equal to voltage magnitude at terminal BIAS | Logic low value |
| Logic high (clamp mode) | Greater than voltage magnitude at terminal BIAS | Logic low value |

Hot-swap/clamp control block 134 also provides the signal to terminal SHUT OFF via shut off control block 348. The logic level at terminal SHUT OFF, as discussed in more detail below, is used by pre-driver 116 of FIG. 1 to determine whether output buffer 104 is in tri-state mode, i.e., input buffer 140 is actively receiving an input signal from input pad 110, or whether output buffer 104 is actively driving an output signal to output pad 110.

Signal TS ENABLE-B is a signal provided by fabric 102 and is deasserted to a logic low level when output buffer 118 is tri-stated. In response, the output of inverter 356 is asserted to a logic high level, which charges terminal SHUT OFF to within one $V_t$ of $V_{CCO}$ through diode connected transistor 354. Conversely, signal TS ENABLE-B is asserted to a logic high level when output buffer 118 is actively driving output pad 110. In response, transistor 352 is rendered conductive and pulls the voltage magnitude that is present at terminal SHUT OFF to a logic low level. Referring back to Table 1, it can be verified that transistor 350 is rendered conductive during an over-voltage event when clamp mode is disabled to apply the voltage magnitude that is present at terminal PIN to terminal SHUT OFF; otherwise, transistor 350 remains non-conductive. As discussed in more detail below, signal SHUT OFF is further utilized by pre-driver 116 of FIG. 1 to provide current conduction control in both the hot-swap and clamp modes of operation.

Figure 4:
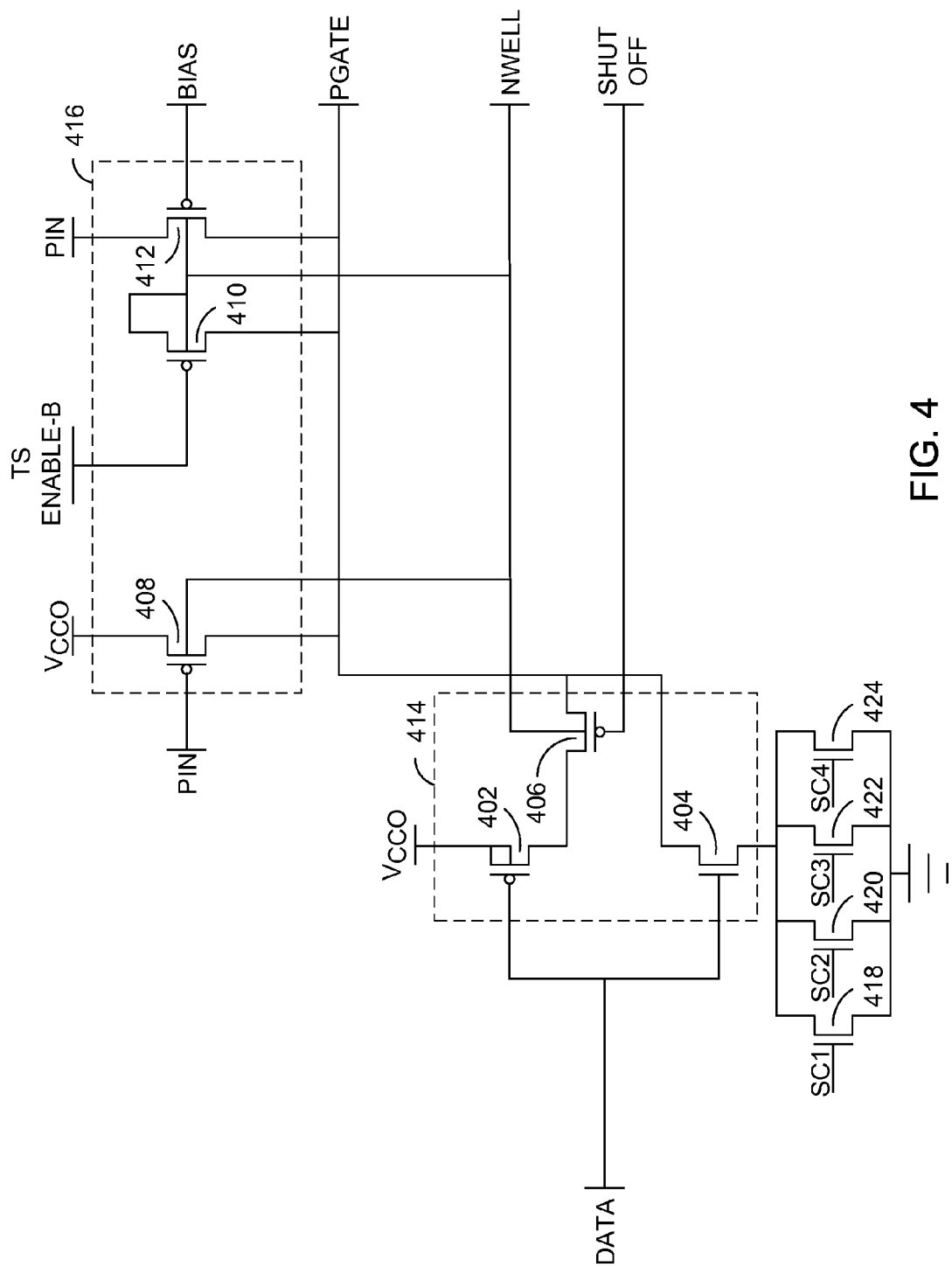
FIG. 4 illustrates a schematic diagram of a portion of the pre-driver of the I/O interface of FIG. 1 in accordance with an embodiment of the present invention.

Turning to FIG. 4, a portion of pre-driver 116 of FIG. 1 is illustrated. Signal DATA is received by pre-driver 116 from level shifter 114, which converts data signals from fabric 102 that are operating at $V_{DD}$ voltage magnitudes to data signals that are operating at $V_{CCO}$ magnitudes. Inverter 414, as formed by transistors 402 and 404, receives the level shifted signal, DATA, from level shifter 114 to provide additional drive level to terminal PGATE, which as discussed above in relation to FIG. 2, provides the selection signal to driver 118 when a logic high level is to be provided to output pad 110, i.e., when signal DATA is asserted to a logic high level to render transistor 404 conductive thus deasserting signal PGATE.

In order to provide programmable slew rate control, transistors 418-424 are provided to select a programmable magnitude of drain current that is to be conducted by transistor 404. That is to say, in other words, that transistors 418-424 receive slew rate control values, SC1-SC4, from slew rate control block 132 so as to independently control the conduction state of transistors 418-424 to determine the magnitude of drain current that is conducted by transistor 404.

If a fast slew rate is required, for example, then each of transistors 418-424 may be rendered conductive by slew rate control values, SC1-SC4, to maximize the rate at which signal PGATE transitions from a logic high level to a logic low level by maximizing the magnitude of drain current conducted by transistor 404. Conversely, if a slow slew rate is required, then only a single transistor, e.g., transistor 424, may be rendered conductive by slew rate control values, SC1-SC4, to minimize the rate at which signal PGATE transitions from a logic high level to a logic low level by minimizing the magnitude of drain current conducted by transistor 404. It can be seen, therefore, that any combination of transistors 418-424 may be rendered conductive so as to implement a programmable slew rate control.

In operation, pull-up block 416 is effective to charge terminal PGATE to the voltage magnitude that is present at terminal PIN during an over-voltage event while in hot-swap mode, so as to defeat the current conduction path from terminal PIN to $V_{CCO}$ through transistor 202 as discussed above in relation to FIG. 2. In so doing, however, another current conduction path is created from terminal PGATE to $V_{CCO}$ through transistor 402, since the source and well terminals of transistor 402 are connected to $V_{CCO}$.

Transistor 406 is, therefore, placed in series with terminal PGATE, as illustrated, to defeat the current conduction path. In particular, transistor 406 is rendered non-conductive by asserting the logic level of signals SHUT OFF and NWELL to be equal to the voltage magnitude at terminal PIN to defeat the current conduction path between terminal PGATE and $V_{CCO}$ during an over-voltage event in hot-swap mode. In clamp mode, on the other hand, signal SHUT OFF is deliberately held to a logic low level by shut-off control block 348 so as to encourage current flow from PGATE to $V_{CCO}$, which increases the effectiveness of over-voltage protection during clamp mode. Turning to Table 3, a summary of the operation of signal SHUT OFF is provided.

TABLE 3

| OPERATIONAL MODE | PIN VOLTAGE | SIGNAL SHUT OFF |
|---|---|---|
| Tri-state disabled | N/A | Logic low level |
| Unpowered | Greater than $V_{CCO}$ | Equal to voltage at terminal PIN |
| Tri-state enabled | Less than or equal to $V_{CCO}$ | One $V_t$ lower than $V_{CCO}$ |
| Tri-state enabled; clamp mode disabled | Greater than $V_{CCO}$ | Equal to voltage at terminal PIN |
| Tri-state enabled; clamp mode enabled | Greater than $V_{CCO}$ | Logic low level |

Pull-up block 416 is further effective to control the voltage magnitude of terminal PGATE during instances where terminal PGATE is not controlled by pre-driver 116, i.e., during tri-state mode, and during over-voltage events while output buffer 104 is powered or not. During tri-state mode, for example, transistor 408 pulls the voltage magnitude at terminal PGATE to $V_{CCO}$, so as to ensure that terminal PGATE is asserted to a logic high level when output driver 104 is tri-stated. Transistor 410 is utilized during tri-state mode to charge terminal NWELL to the voltage magnitude at terminal PGATE, so as to prevent the voltage level at terminal NWELL from floating during tri-state mode.

During over-voltage events, transistor 412 is utilized. In particular, during hot-swap mode, the voltage magnitude of signal BIAS is equal to $V_{CCO}$ during an over-voltage event, as verified by Table 1. In such an instance, transistor 412 is rendered conductive to apply the voltage magnitude at terminal PIN to terminal PGATE, which is effective to defeat the current path from terminal PIN to $V_{CCO}$ through transistor 202 of FIG. 2. If clamp mode is enabled, on the other hand, transistor 412 is rendered non-conductive, since the voltage magnitude of signal BIAS is equal to the voltage magnitude at terminal PIN, as verified by Table 1. In such an instance, the voltage magnitude at terminal PGATE is deliberately held to $V_{CCO}$, which allows current from terminal PIN to flow out $V_{CCO}$ through transistor 202 to facilitate over-voltage protection at terminal PIN.

If output buffer 104 is not powered, i.e., the voltage magnitude of $V_{CCO}$ and signal BIAS is near zero volts, then transistor 412 is rendered conductive during an over-voltage event if the voltage at terminal PIN exceeds one $V_t$ of PMOS transistor 412. In such an instance, terminal PGATE is pulled to the voltage magnitude present at terminal PIN, which causes transistor 202 to remain non-conductive to defeat the current path from terminal PIN to $V_{CCO}$ through transistor 202 while output buffer 104 remains un-powered.

Figure 5:
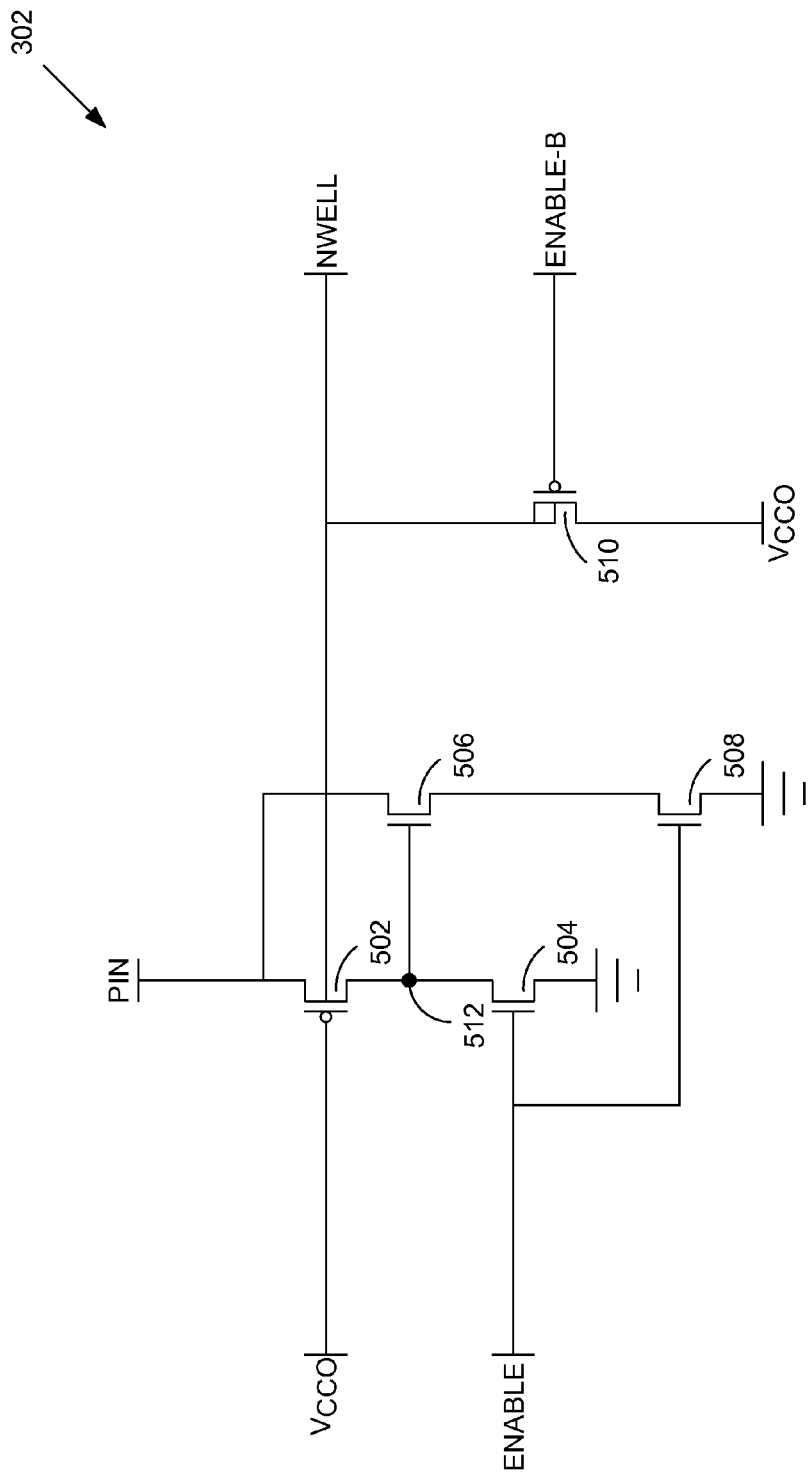
FIG. 5 illustrates a schematic diagram of the active clamp circuit of FIG. 3 in accordance with an embodiment of the present invention.

Turning to FIG. 5, a schematic diagram of active clamp 302 of FIG. 3 is illustrated. Active clamp 302 detects over-voltage events and in response, activates NMOS transistors to shunt the excess current that is due to the over-voltage event to a reference potential, e.g., ground potential. In contrast, PMOS transistor 202 of FIG. 2, as discussed above, behaves as a passive current clamp during clamp mode, since PMOS transistor 202 behaves as a forward-biased diode to shunt excess current to $V_{CCO}$ during an over-voltage event during clamp mode. Thus, active clamp 302 of FIG. 5 and PMOS transistor 202 of FIG. 2 operate in parallel to conduct a sufficient magnitude of current from terminal PIN during an over-voltage event while operating in clamp mode to limit the voltage magnitude at terminal PIN to $V_{CCO}$.

During clamp mode, signal ENABLE is asserted to a logic high level and signal ENABLE-B is deasserted to a logic low level. During an over-voltage event, transistor 502 becomes conductive when the voltage magnitude at terminal PIN exceeds $V_{CCO}$ by one $V_t$ of PMOS transistor 502, which then causes the voltage magnitude at node 512 to increase. Transistor 506 then becomes conductive and transistor 508 is also conductive in response to the logic high level of signal ENABLE. Thus, transistors 506 and 508 combine to provide a clamp current path from terminal PIN to ground potential during the over-voltage event. Signal ENABLE also renders transistor 504 conductive, which acts as a pull-down circuit to deassert node 512 to a logic low level once the over-voltage event subsides. As such, transistor 504 is effective to render transistor 506 non-conductive, so as to defeat the clamp current path from terminal PIN to ground potential once the over-voltage event subsides.

In addition, transistor 510 is rendered conductive during clamp mode, so as to allow current to flow from terminal NWELL to $V_{CCO}$ during an over-voltage event, which causes the voltage magnitude at terminal NWELL to drop slightly. The current path created by transistor 510 not only increases current conduction during an over-voltage event, but also decreases the threshold voltage of transistor 202 of FIG. 2 by virtue of the body effect, which further enhances current conduction by transistor 202 during an over-voltage event.

Figure 6:
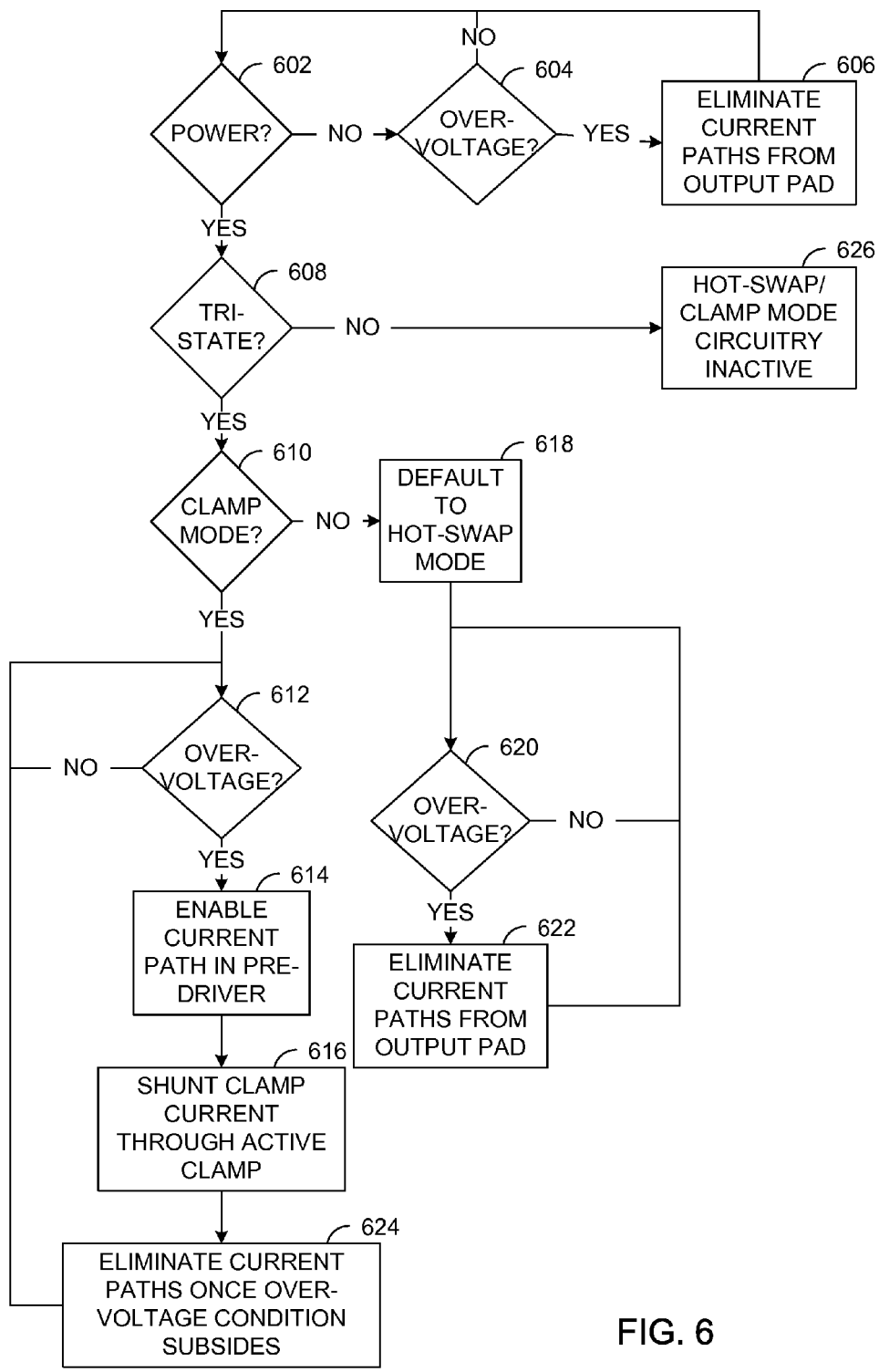
FIG. 6 illustrates a flow diagram of the operation of the I/O interface of FIG. 1 in accordance with an embodiment of the present invention.

Turning to FIG. 6, a flow diagram of the operation of output buffer 104 of FIG. 1 during the hot-swap and clamp modes of operation is illustrated. In step 602, a determination is made as to whether output buffer 104 is either unpowered, or in a power-on reset mode, in which case the voltage magnitude of $V_{CCO}$ has not yet attained an operational level. Hot-swap control of output buffer 104 is, nevertheless, operative during the over-voltage event of step 604, since transistor 412 of pull-up block 416 of FIG. 4 is effective to pull the voltage magnitude that is present at terminal PGATE to the voltage magnitude of terminal PIN. In such an instance, PMOS transistor 202 of FIG. 2 is rendered non-conductive in step 606, so as to defeat the current path from output pad 110 through transistor 202 to $V_{CCO}$ during the over-voltage event.

In step 608, tri-state mode is either activated or deactivated by signal TS ENABLE-B as provided by fabric 102. If tri-state mode is deactivated, as determined in step 608, then output buffer 104 is actively driving an output signal to output pad 110. No input signal is expected to be received at output pad 110 and, therefore, the hot-swap/clamp mode circuitry remains inactive as in step 626. If tri-state mode is activated and if clamp mode is activated as determined in step 610, on the other hand, then a determination is made in step 612 as to whether an over-voltage event has occurred. If an over-voltage event has occurred during tri-state mode, then bias control 334 of FIG. 3 asserts signal BIAS to be equal to the voltage magnitude that is present at terminal PIN.

In such an instance, transistor 412 of pull-up block 416 is rendered non-conductive so as to allow transistor 408 of pull-up block 416 to maintain the voltage magnitude of terminal PGATE to be equal to $V_{CCO}$, which in turn allows transistor 202 of FIG. 2 to remain conductive during the over-voltage event. Thus, transistor 202 behaves as a passive current conduction device to conduct a portion of the clamp current that is required to maintain the voltage magnitude at terminal PIN to be substantially equal to $V_{CCO}$ during the over-voltage event, as required by certain I/O standards, such as PCI33 and PCI66.

In addition, signal SHUT OFF is deliberately held to a logic low level by shut-off control block 348 in step 614, which causes shut-off transistor 406 of FIG. 4 to remain conductive during the over-voltage event. As such, an additional current path exists from terminal PGATE to $V_{CCO}$ through transistor 402, so as to conduct a portion of the clamp current that is required to maintain the voltage magnitude at terminal PIN to be substantially equal to $V_{CCO}$ during the over-voltage event.

In step 616, active clamp 302, as discussed above in relation to FIG. 5, is rendered conductive so as to conduct the remaining portion of current from terminal PIN to ground potential during the over-voltage event. In addition, well-bias control block 310 asserts the voltage magnitude of bias signal NWELL to be equal to $V_{CCO}$, so as to lower the threshold voltage of PMOS transistor 202. In response, the conduction of PMOS transistor 202 is enhanced due to the body effect, which further increases clamp current conduction during the over-voltage event. Once the over-voltage event subsides, current paths created in steps 614 and 616 are eliminated in step 624 and operation returns to step 612 as discussed above.

If tri-state mode is activated, but clamp mode is not, then hot-swap mode is activated by default, as in step 618. A determination is then made in step 620 as to whether an over-voltage event has occurred. If an over-voltage event has occurred, then the current conduction path from output pad 110 to $V_{CCO}$ is defeated as in step 622. In particular, signal PGATE is asserted to the voltage magnitude that is present at terminal PIN by transistor 412 of pull-up block 416. In such an instance, transistor 412 is made conductive by bias control block 334, since bias control block 334 asserts the voltage magnitude of signal BIAS to be equal to $V_{CCO}$ during hot-swap mode. Since terminal PGATE is asserted to the voltage magnitude that is present at terminal PIN, transistor 202 is rendered non-conductive to defeat the current path from terminal PIN to $V_{CCO}$ through transistor 202. In addition, shut-off transistor 406 is rendered non-conductive in step 622, by virtue of: 1) shut-off control block 348 asserting the voltage magnitude of signal SHUT OFF to be equal to the voltage magnitude that is present at terminal PIN; and 2) well bias control block 310 asserting the voltage magnitude of signal NWELL to be equal to the voltage magnitude that is present at terminal PIN.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of operating an input/output interface, comprising:
    eliminating a current path into an output pin of the input/output interface while the input/output interface does not receive an operational power signal;
    eliminating the current path into the output pin of the input/output interface while the input/output interface receives the operational power signal during a first mode of operation; and
    enabling the current path into the output pin of the input/output interface to limit a voltage magnitude externally applied to the output pin of the input/output interface during a second mode of operation, the external voltage magnitude being limited to a voltage magnitude of the operational power signal.

2. The method of claim 1, wherein eliminating a current path into an output pin of the input/output interface while the input/output interface does not receive an operational power signal comprises:
   detecting the external voltage magnitude at the output pin of the input/output interface;
   applying the external voltage magnitude as a selection signal of an output buffer of the input/output interface; and
   rendering the output buffer non-conductive in response to the selection signal.

3. The method of claim 1, wherein eliminating the current path into the output pin of the input/output interface while the input/output interface receives the operational power signal during a first mode of operation comprises:
   detecting the external voltage magnitude at the output pin of the input/output interface; and
   asserting a first bias signal to be equal to the voltage magnitude of the operational power signal in response to the first mode of operation.

4. The method of claim 3, further comprising:
   rendering a first conduction device conductive in response to the external voltage magnitude and the first bias signal;
   applying the external voltage magnitude as a selection signal of an output buffer of the input/output interface in response to the conduction state of the first conduction device; and
   rendering the output buffer non-conductive in response to the selection signal.

5. The method of claim 4, further comprising:
   asserting a first control signal to be equal to the external voltage magnitude;
   asserting a second bias signal to be equal to the external voltage magnitude;
   applying the first control signal to a control terminal of a second current conduction device;
   applying the second bias signal to a well region of the second current conduction device; and
   rendering the second current conduction device non-conductive in response to the first control signal and the second bias signal.

6. The method of claim 1, wherein enabling the current path into the output pin of the input/output interface to limit a voltage magnitude externally applied to the output pin of the input/output interface during a second mode of operation comprises:
   detecting the external voltage magnitude at the output pin of the input/output interface; and
   asserting the first bias signal to be equal to the external voltage magnitude in response to detecting the external voltage magnitude and the second mode of operation.

7. The method of claim 6, further comprising:
   rendering a first conduction device non-conductive in response to the external voltage magnitude and the first bias signal;
   applying the voltage magnitude of the operational power signal as a selection signal of an output buffer of the input/output interface in response to the conduction state of the first conduction device; and
   rendering the output buffer conductive in response to the selection signal.

8. The method of claim 7, further comprising:
   deasserting a first control signal to a logic low level;
   asserting a second bias signal to be equal to the voltage magnitude of the operational power signal;
   applying the first control signal to a control terminal of a second current conduction device;
   applying the second bias signal to a well region of the second current conduction device; and
   rendering the second current conduction device conductive in response to the first control signal and the second bias signal.

9. The method of claim 8, further comprising:
   activating a clamp circuit in response to the external voltage magnitude and the second mode of operation; and
   conducting a current from the output pin of the input/output interface to limit the external voltage magnitude to the voltage magnitude of the operational power signal.

10. The method of claim 9, further comprising applying the second bias signal to the output buffer to increase the conductivity of the output buffer in response to the external voltage magnitude and the second mode of operation.

11. A method of operating an input/output interface, comprising:
   eliminating a current path into an output pin of an input/output interface while the input/output interface receives an operational power signal during a first mode of operation;
   detecting an external voltage magnitude at the output pin of the input/output interface; and
   enabling the current path into the output pin of the input/output interface to limit the external voltage magnitude applied to the output pin of the input/output interface when the external voltage magnitude exceeds a predetermined value during a second mode of operation.

12. The method of claim 11, wherein eliminating the current path into the output pin of the input/output interface while the input/output interface receives the operational power signal during a first mode of operation comprises:
   asserting a first bias signal to be equal to the voltage magnitude of the operational power signal in response to the first mode of operation.

13. The method of claim 12, further comprising:
   rendering a first conduction device conductive in response to the external voltage magnitude and the first bias signal;
   applying the external voltage magnitude as a selection signal of an output buffer of the input/output interface in response to a conduction state of the first conduction device; and
   rendering the output buffer non-conductive in response to the selection signal.

14. The method of claim 13, further comprising:
   asserting a first control signal to be equal to the external voltage magnitude;
   asserting a second bias signal to be equal to the external voltage magnitude;
   applying the first control signal to a control terminal of a second current conduction device;
   applying the second bias signal to a well region of the second current conduction device; and
   rendering the second current conduction device non-conductive in response to the first control signal and the second bias signal.

15. The method of claim 11, wherein the first mode of operation is a hot mode of operation and the second mode of operation is a clamping mode of operation.

* * * * *